(12) United States Patent
New

(10) Patent No.: US 7,830,171 B1
(45) Date of Patent: Nov. 9, 2010

(54) METHOD AND APPARATUS FOR INITIALIZING AN INTEGRATED CIRCUIT

(75) Inventor: Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/509,400

(22) Filed: Jul. 24, 2009

(51) Int. Cl.
G06F 7/38 (2006.01)
H03K 19/173 (2006.01)

(52) U.S. Cl. .............................. 326/40; 326/39; 326/41

(58) Field of Classification Search ........................ None
See application file for complete search history.

(56) References Cited

U.S. PATENT DOCUMENTS

| | | | |
|---|---|---|---|
| 6,363,019 B1 * | 3/2002 | Erickson et al. | 365/189.07 |
| 7,030,488 B2 * | 4/2006 | Kiss | 257/723 |
| 7,362,133 B2 * | 4/2008 | Madurawe | 326/38 |
| 7,671,624 B1 * | 3/2010 | Walstrum, Jr. | 326/38 |

OTHER PUBLICATIONS

Black, William C., et al., "Programmable logic using giant-magnetoresistance and spin-dependent tunneling devices (invited)", Journal of Applied Physics, vol. 87, No. 9, Parts 2 and 3, May 1, 2000, pp. 6674-6679.
Hassoun, Marwan M., et al., "Field Programmable Logic Gates Using GMR Devices", IEEE Transactions on Magnetics, vol. 33, No. 5, Sep. 1997, pp. 3307-3309.
BBC News, Plastic promises dense data store, Nov. 28, 2003, 2 pages, http://news.bbc.co.uk/2/hi/technology/3245822.stm.
Erico Guizzo, "Organic Memory Gains Momentum", Hybrid prototypes promise to give conventional memory a run for the memory, IEEE Spectrum, Apr. 2004, pp. 17-18.
Rosenfeld, Ed, "Intel Chip Tricks Extend Moore's Law, Again", HPC wire, Dec. 5, 2003: vol. 12, No. 48, 5 pages, http://www.tgc.com/hpcwire/hpcwireWWW/03/1205/106588.html.
Schultz, Steven, "Discovery of new property in commonly used plastic leads to invention", Princeton Weekly Bulletin, Dec. 8, 2008, 1 page, vol. 93, No. 12, http://www.princeton.edu/pr/pwb/03/1208/.
Smith, S. and Forrest S.R., "A low switching voltage organic-on-inorganic heterojunction memory element utilizing a conductive polymer fuse on a doped silicon substrate", Applied Physics Letters, American Institute of Physics, Jun. 14, 2004, vol. 84, Issue 24, pp. 5019-5021.

* cited by examiner

Primary Examiner—Anh Q Tran
(74) Attorney, Agent, or Firm—Robert M. Brush

(57) ABSTRACT

Method and apparatus for initializing an integrated circuit are described. A static memory includes an array of memory cells having control lines coupled to a column select component and data lines coupled to a register component. The static memory is formed in one or more first process layers of the integrated circuit. A non-volatile memory includes an array of non-volatile memory cells disposed between column electrodes and row electrodes. The non-volatile memory is formed in one or more second process layers of the integrated circuit disposed above the one or more first process layers. An interface circuit is configured to couple the column select component to the column electrodes and the register component to the row electrodes.

20 Claims, 7 Drawing Sheets

METHOD AND APPARATUS FOR INITIALIZING AN INTEGRATED CIRCUIT

FIELD OF THE INVENTION

One or more aspects of the present invention relate generally to integrated circuits and, more particularly, to a method and apparatus for initializing an integrated circuit.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs), programmable input/output blocks (IOBs), and like type programmable elements. The CLBs and IOBs are interconnected by a programmable interconnect structure. An FPGA may also include various dedicated logic circuits, such as memories, digital clock managers (DCMs), and input/output (I/O) transceivers. Notably, an FPGA may include one or more embedded processors. The programmable resource such as, e.g., programmable logic of an FPGA (e.g., CLBs, IOBs, and interconnect structure) is typically programmed by loading a stream of configuration data (known as a bitstream) into internal configuration memory cells. The bitstream is typically stored in an external nonvolatile memory, such as an erasable programmable read only memory (EPROM). The states of the configuration memory cells define how the CLBs, IOBs, interconnect structure, and other programmable logic are configured. The configuration memory cells typically comprise static random access memory (SRAM) or like type volatile memory cells.

When power is removed from the FPGA, the configuration data is lost. Consequently, when the FPGA again receives power, the configuration data must be reloaded from the non-volatile source. Use of such an external nonvolatile memory, however, increases the cost of using the FPGA. Furthermore, the large quantity of configuration data that must be loaded in present FPGAs, combined with the limited bandwidth normally afforded the configuration process, leads to a significant delay between when a device is powered and when the device becomes operational. Accordingly, there exists a need in the art for a method and apparatus for initializing a programmable logic device that reduces or eliminates the requirements of an external nonvolatile memory for configuration.

SUMMARY OF THE INVENTION

One embodiment of the integrated circuit (IC) comprises a static memory that includes an array of memory cells having control lines coupled to a column select component and data lines coupled to a register component. The static memory is formed in one or more first process layers of the integrated circuit. A non-volatile memory includes an array of non-volatile memory cells disposed between column electrodes and row electrodes. The non-volatile memory is formed in one or more second process layers of the integrated circuit disposed above the one or more first process layers. An interface circuit is configured to couple the column select component to the column electrodes and the register component to the row electrodes.

In this embodiment, the non-volatile memory can be disposed in process layers of the integrated circuit above the static memory. The non-volatile memory cells can comprise write-once memory cells, where the interface circuit includes: first circuits, respectively coupled between the column select component and the column electrodes, configured to apply voltage to a selected one of the column electrodes; second circuits, respectively coupled between the data lines and the row electrodes, configured to sense current on the row electrodes. Each of the first circuits can include: a first input configured to receive a read signal; a second input configured to receive a write signal; a third input configured to receive a select signal from the column select component; and voltage select logic configured to cause the voltage applied to the selected column electrode to be a first voltage responsive to the read signal and a second voltage responsive to the write signal, the first voltage being insufficient to change character of the write-once memory cells and the second voltage being sufficient to change the character of the write-once memory cells.

In this embodiment, each of the second circuits can include: a first input configured to receive a write data signal from the register component; a second input configured to receive the write signal; and at least one pull-down transistor coupled to a respective one of the row electrodes; and a buffer coupled between a respective one of the row electrodes and a respective one of the data lines. Each of the second circuits can further include a third input configured to receive a precharge signal. Multiplexers can be coupled respectively between the data lines and the second circuits. The IC can further comprise programmable logic, where the second circuits are further coupled to the programmable logic. In addition, the IC can further comprise programmable logic, where the static memory comprises configuration memory for the programmable logic. The non-volatile memory cells can comprise one of fuse elements, antifuse elements, polymer elements, or multiwrite elements.

Another embodiment of the IC includes a programmable resource and a configuration memory is configured to store configuration data to configure the programmable resource. Configuration resource is configured to load the configuration data to the configuration memory. A non-volatile memory includes an array of non-volatile memory cells. An interface circuit is coupled between the configuration resource and the non-volatile memory. The interface circuit is configured to selectively change character of the non-volatile memory cells to write a bitmap, and sense the non-volatile memory cells to read a portion of the bitmap to the configuration resource as a portion of the configuration data.

In this embodiment, the configuration resource can include a frame register, where the configuration data comprises a plurality of frames each being a width of the frame register, and where the interface circuit senses the non-volatile memory cells to read the portion of the bitmap a frame at a time. The configuration resource can include a frame register component and a column select component, where the non-volatile memory shares the column select component with the configuration resource. The interface circuit can be further configured to sense the non-volatile memory to read a portion of the bitmap to the programmable resource during runtime. The non-volatile memory cells can be disposed between column electrodes and row electrodes.

An embodiment of a method of initializing an integrated circuit having a configuration logic formed in one or more first process layers and a non-volatile memory formed in one or more second process layers disposed above the one or more first process layers, the non-volatile memory includes an array of non-volatile memory cells, a portion of which are configured to define a bitmap, the method comprises the following: sensing the non-volatile memory cells to read a portion of the bitmap to the configuration resource; and loading the portion of the bitmap from the configuration resource to configuration memory as a portion of the configuration data for the integrated circuit.

In this embodiment, the method can further include: sensing, upon instruction of the portion of the configuration data, the non-volatile memory cells to read another portion of the bitmap to the configuration resource; and loading the other portion of the bitmap from the configuration resource to the configuration memory as another portion of the configuration data. In addition, the method can further include: obtaining, upon instruction of the portion of the configuration data, another portion of the configuration data from an external memory coupled to the integrated circuit; and loading the other portion of the configuration data to the configuration memory. Moreover, the method can further include sensing, during runtime of the integrated circuit, the non-volatile memory cells to read another portion of the bitmap to programmable resource of the integrated circuit. The non-volatile memory cells can be disposed between column electrodes and row electrodes, where the step of sensing can comprise: applying a column select signal from the configuration resource to the non-volatile memory to select one of the column electrodes; applying voltage to the selected column electrode, the voltage insufficient to change character of the non-volatile memory cells; and sensing current on the row electrodes, the current on each of the row electrodes being indicative of a bit of the bitmap.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
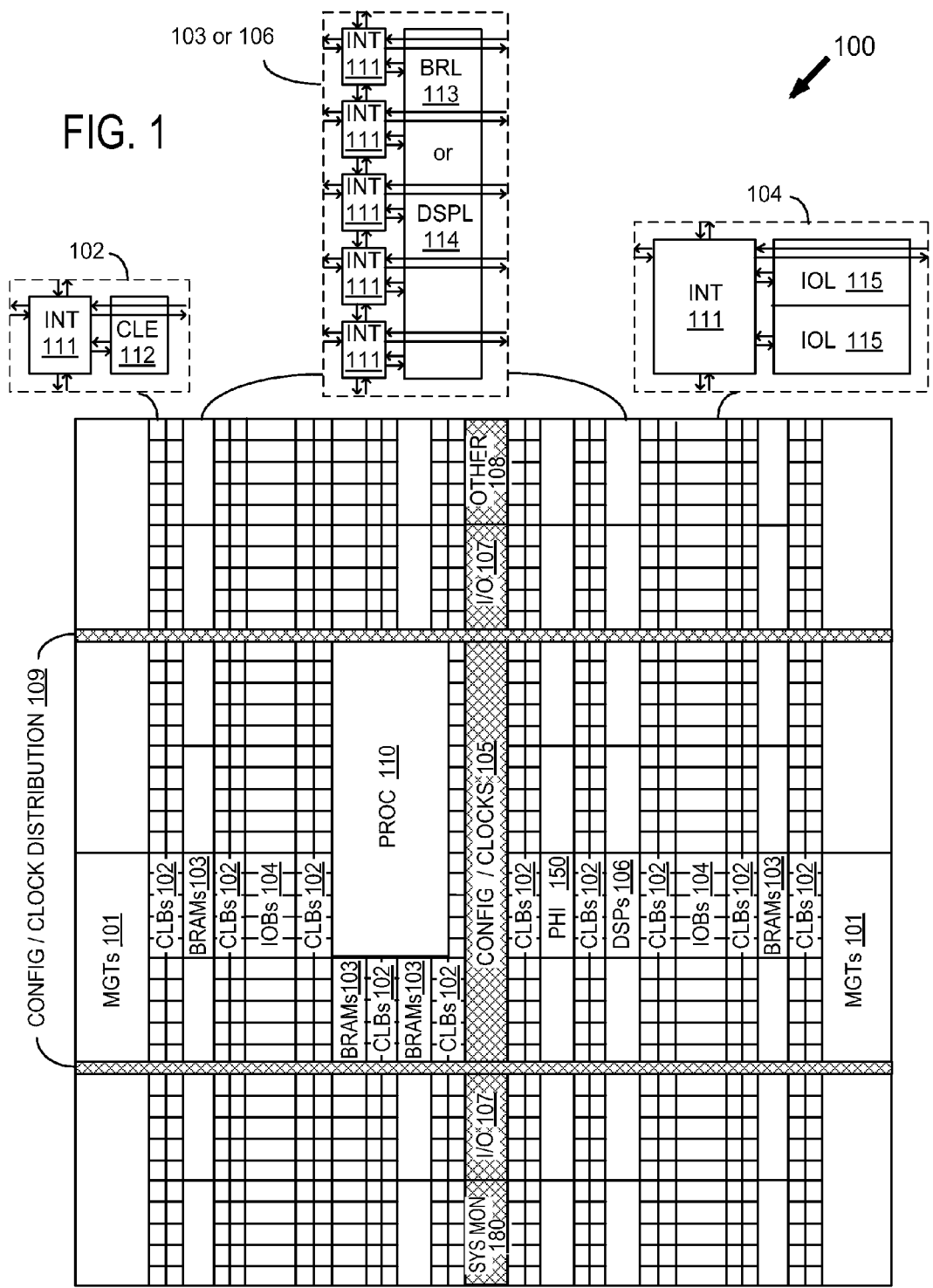
FIG. 1 illustrates an exemplary architecture for a programmable logic plane of an FPGA.
Figure 2:
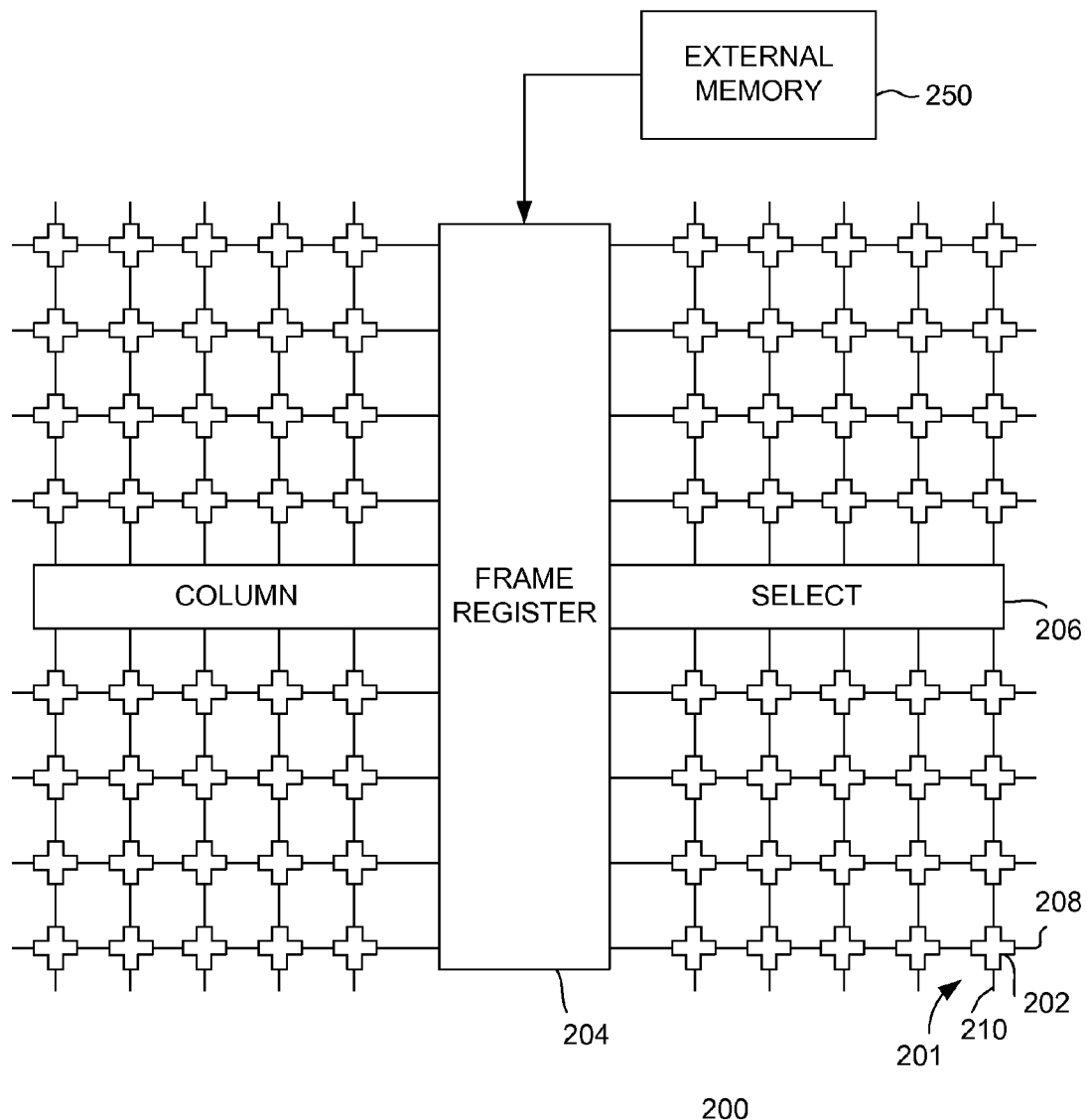
FIG. 2 is a block diagram depicting an exemplary architecture for a configuration plane of an FPGA.
Figure 3:
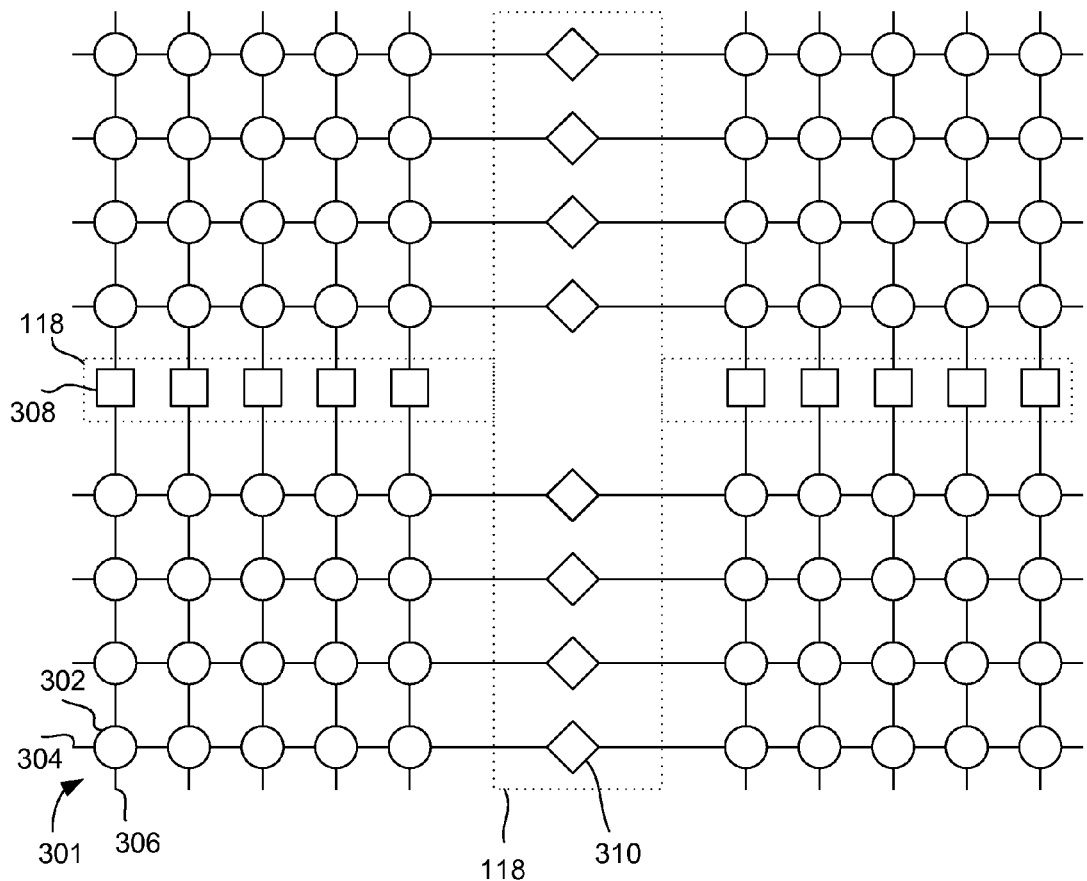
FIG. 3 is a block diagram depicting an exemplary architecture for a non-volatile memory plane in accordance with one or more aspects of the invention.

Method and apparatus for initializing a programmable logic device (PLD) are described. Aspects of the invention are described with specific reference to field programmable gate arrays (FPGAs). Some or all of the various aspects of the invention may be used, however, in other types of PLDs, such as complex programmable logic devices (CPLDs) and the like. A simplified representation of an FPGA is shown in FIGS. 1-3 and described below. An FPGA is an integrated circuit (IC) having various process layers formed on a semiconductor substrate. The process layers are fabricated to form various circuits and conductive interconnect, as is well known in the art. The IC is typically housed in a package having externally accessible pins. To simplify the following description, the FPGA described below is functionally and logically separated into a programmable logic plane 100 (FIG. 1), a configuration plane 200 (FIG. 2), and a non-volatile memory plane 300 (FIG. 3).

FIG. 1 illustrates an exemplary architecture for the programmable logic plane 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration resource such as, e.g., configuration logic 116, clocking logic 117, digital signal processing blocks (DSPs) 106, specialized input/output blocks (I/O) 107 (e.g., configuration ports and clock ports), and other programmable blocks 108, such as digital clock managers, analog-to-digital converters, system monitoring logic, and so forth. The layout of the physical structures implementing the programmable logic plane 100 on the IC may be the same or similar to the layout of the logical architecture shown in FIG. 1.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The INT 111 also includes the connections to and from the programmable logic element within the same tile, as shown by the examples included at the top of FIG. 1. The programmable tiles and corresponding programmable interconnect structure are generally referred to as "programmable logic."

For example, a CLB 102 can include a configurable logic element (CLE) 112 that can be programmed to implement user logic plus a single INT 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 may also include one or more dedicated processor blocks (PROC) 110. The processor block 110 comprises a microprocessor core, as well as associated control logic. The processor block 110 is coupled to the programmable logic of the FPGA in a well known manner.

In the pictured embodiment, a columnar area 105 near the center of the die (shown shaded in FIG. 1) is used for the configuration logic, the clock logic, the I/O logic 107, and the other control logic 108. Horizontal areas 109 extending from this column are used to distribute the clocks and configuration signals across the breadth of the FPGA. Configuration information for the programmable logic is stored in configuration memory (shown in FIG. 2). The configuration logic provides an interface to, and loads configuration data to, the configuration memory. A stream of configuration data ("configuration bitstream") may be coupled to the configuration logic, which in turn loads the configuration memory. The columnar area 105 may also include an interface circuit 118 that provides an interface between the non-volatile memory plane 300 and the configuration logic/configuration memory. As discussed in more detail below, at least a portion of the configuration data stored in the configuration memory may be obtained from the non-volatile memory plane 300, which provides an internal source of such data.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 1 are purely exemplary. For example, in an actual FPGA more than one adjacent column of CLBs is typically included wherever the CLBs appear, to facilitate the efficient implementation of user logic.

FIG. 2 is a block diagram depicting an exemplary architecture for the configuration plane 200. The configuration plane 200 comprises a configuration memory 201 that includes an array of memory cells 202. The configuration memory 201 comprises a static memory and is volatile in that when the FPGA is powered down, the information stored in the configuration memory is lost. The configuration plane 200 also includes a register component such as, e.g., a frame register 204 extending vertically, and a column select component such as, e.g., column select logic 206 extending horizontally. The frame register 204 drives a plurality of data lines 208 that extend horizontally. The column select logic 206 drives select lines 210 that extend vertically. The memory cells 202 are arranged in rows and columns. Each of the memory cells 202 includes a data input and an address input. Data inputs of memory cells in each row are coupled to a respective one of the data lines 208. Address inputs of memory cells in each column are coupled to a respective one of the select lines 210. A signal applied on an address input of a memory cell controls when data on the data input is written to, or read from, the memory cell. The frame register 204 and the column select logic 206 are part of the configuration logic 116 (and 109).

The frame register 204 stores data prior to transfer into the memory cells 202. Notably, configuration data comprises a sequence of frames and the frame register 204 has a width such that a frame can be stored therein. The column select logic 206 selects a column of memory cells by asserting a signal on the respective one of the select lines 210. A frame of configuration data is loaded into the frame register 204 and transferred from the frame register 204 to the selected column of memory cells via the data lines 208. Another frame is then loaded into the frame register 204, the column select logic 206 selects another column of memory cells, and the other frame is transferred from the frame register 204 to the other selected column of memory cells. This process is repeated to load additional columns of the memory cells 202.

In one configuration mode, frames of configuration data are loaded into the frame register 204 from an external memory 250. The external memory 250 is external to the FPGA and may comprise a nonvolatile memory that stores configuration data. The loading of configuration data into the frame register 204 from the external memory 250 is referred to herein as a "legacy mode" of configuration. In accordance with aspects of the invention, an additional configuration mode is provided where frames of configuration data are loaded into the configuration memory 201 from the non-volatile memory plane 300. This configuration mode is referred to herein as the "internal configuration mode," which is described below.

FIG. 3 is a block diagram depicting an exemplary architecture for the non-volatile memory plane 300 in accordance with one or more aspects of the invention. In some embodiments, the non-volatile memory plane 300 comprises a memory 301 that includes an array of non-volatile memory cells 302 (hereinafter referred to as memory cells). The memory cells 302 are arranged in rows and columns. Row electrodes 304 extend horizontally, and column electrodes 306 extend vertically. Each of the memory cells 302 includes two sides. Across each row, one side of each memory cell is coupled to a respective one of the column electrodes 306. That is, each column electrode 306 connects all the memory cells in a given column. Across each column, the other side of each memory cell is coupled to a respective one of the row electrodes 304. That is, each row electrode 304 connects all the memory cells in a given row.

The non-volatile memory plane 300 includes column connection points 308 and row connection points 310. Each of the column connection points 308 couples one of the column electrodes 306 with the interface circuit 118. Each of the row connection points 310 couples one of the row electrodes with the interface circuit 118. The interface circuit 118 couples the non-volatile memory 301 to the configuration logic 116/configuration memory 201. An exemplary embodiment of the interface circuit 118 is described below. In general, the interface circuit 118 couples the column electrodes 306 to the column select lines 210 and the row electrodes to the row select lines 208. In some embodiments, the memory 301 includes a number of the memory cells 302 equal to the number of the configuration memory cells 202. In other embodiments, the memory 301 may include more memory cells 302 than configuration memory cells 202. In such embodiments, the configuration plane 200 is configured with additional column select lines and/or multiplexing logic for interfacing with the column electrodes 306.

Physically within the IC, the non-volatile memory 301 may be formed in process layers above the structures forming the configuration memory 201, the configuration logic 116, and the interface circuit 118. The column electrodes 306 and the row electrodes 204 are formed and connected to the underlying structures of the interface circuit 118. Since the interface circuit 118 is disposed in the central regions of the IC, the only connections between the non-volatile memory 301 and the underlying structures are made in the central regions of the IC.

In some embodiments, the memory cells 302 comprise write-once memory elements. For example, the memory cells 302 may comprise fuse elements. A fuse element is initially conductive and, when exposed to higher voltages and currents, becomes permanently non-conductive. In another example, the memory cells 302 may comprise antifuse elements. An antifuse element is initially non-conductive and, when exposed to higher voltages and currents, becomes permanently conductive. Such fuse elements and antifuse elements are well known in the art. In another example, each of the memory cells 302 comprises a polymer element. An exemplary polymer element is polyethylene dioxythiophene (PEDOT) element. PEDOT is an electrically conductive polymer material that, when exposed to higher voltages and currents, becomes permanently non-conductive. Thus, PEDOT exhibits a classic fuse behavior. The "higher voltages" required to blow a PEDOT element can be as low as 2 or 4 V. The blown to unblown impedance ratio is five orders of magnitude. Those skilled in the art will appreciate that other types of write-once types of memory cells may be employed as the memory cells 302. In some embodiments, the memory cells 302 comprise multiple write cells. For example, the memory cells 302 may comprise thin-film transistor (TFT) memory elements.

Figure 4:
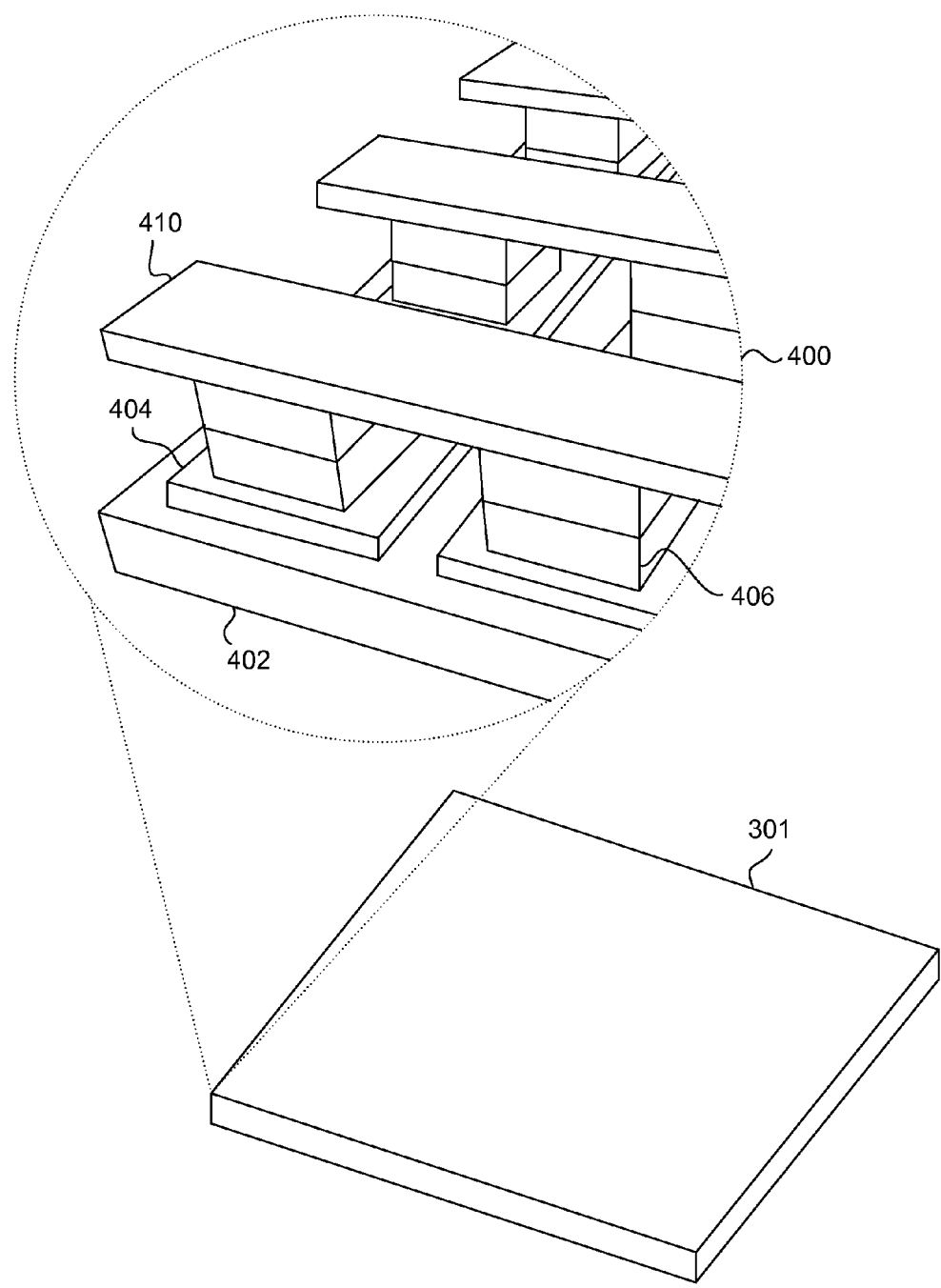
FIG. 4 is a perspective view showing an exemplary embodiment of a portion of a non-volatile memory.

FIG. 4 is a perspective view showing an exemplary embodiment of a portion 400 of the non-volatile memory 301. The non-volatile memory 301 is formed on top of an underlying process layer 402 of the IC. The underlying process layer 402 may be an insulating layer on top of a metal layer of the IC, for example. A metal layer 404 is deposited on the underlying process layer 402 to form the row electrodes 304. Memory elements 406 are then formed on the metal layer 404. The memory elements 406 may comprise fuse elements, antifuse elements, polymer elements, TFT memory elements, or the like and are formed using known processes for such elements. Finally, a metal layer 410 is deposited over the memory elements 406 to form the column electrodes 306. In general, a memory element may represent a bit of data, where one state indicates a logic '0' and another state indicates a logic '1'. Data may be read from or written to a memory element by applying and sensing voltage/current on the appropriate row and column electrodes.

For example, as described above, the non-volatile memory 301 may comprise write-once memory cells. In such embodiments, the non-volatile memory 301 may be read by applying a voltage to one of the column electrodes 306. Current is conducted through the unblown write-once memory cells coupled to the particular column electrode to corresponding row electrodes 304 (e.g., an unblown fuse, antifuse, or polymer memory element). The current on the row electrodes 304 may be sensed and translated into logic '1's and '0's. The voltage applied to the selected column electrode is of a value insufficient to blow the write-once memory cells.

In such embodiments, non-volatile memory 301 may be written to by grounding selected ones of the row electrodes 304 and applying a voltage to a selected one of the column electrodes 306. The voltage applied is of a value sufficient to blow the write-once memory cells. Current flows through each memory cell in a column that is coupled to a grounded row electrode and the write-once memory cell is blown (or closed in case of antifuse). That is, the memory element 406 changes character (e.g., from conductive to non-conductive or vice-versa). Since the change in character is permanent, the non-volatile memory 301 is generally a one-time programmable memory. A pattern of write-once memory cells may be established in the non-volatile memory 301 in accordance with above-described write process. The pattern of write-once memory cells may then be read multiple times using the above-described read process.

For purposes of clarity by example, operation of write-once memory cells is described above. Those skilled in the art will appreciate that other types of memory cells, including multiple write cells, may also be employed, the operation of such being well known in the art. That is, the column and row electrodes may be used to write, read, and clear multiple write memory cells in a well known manner.

Figure 5:
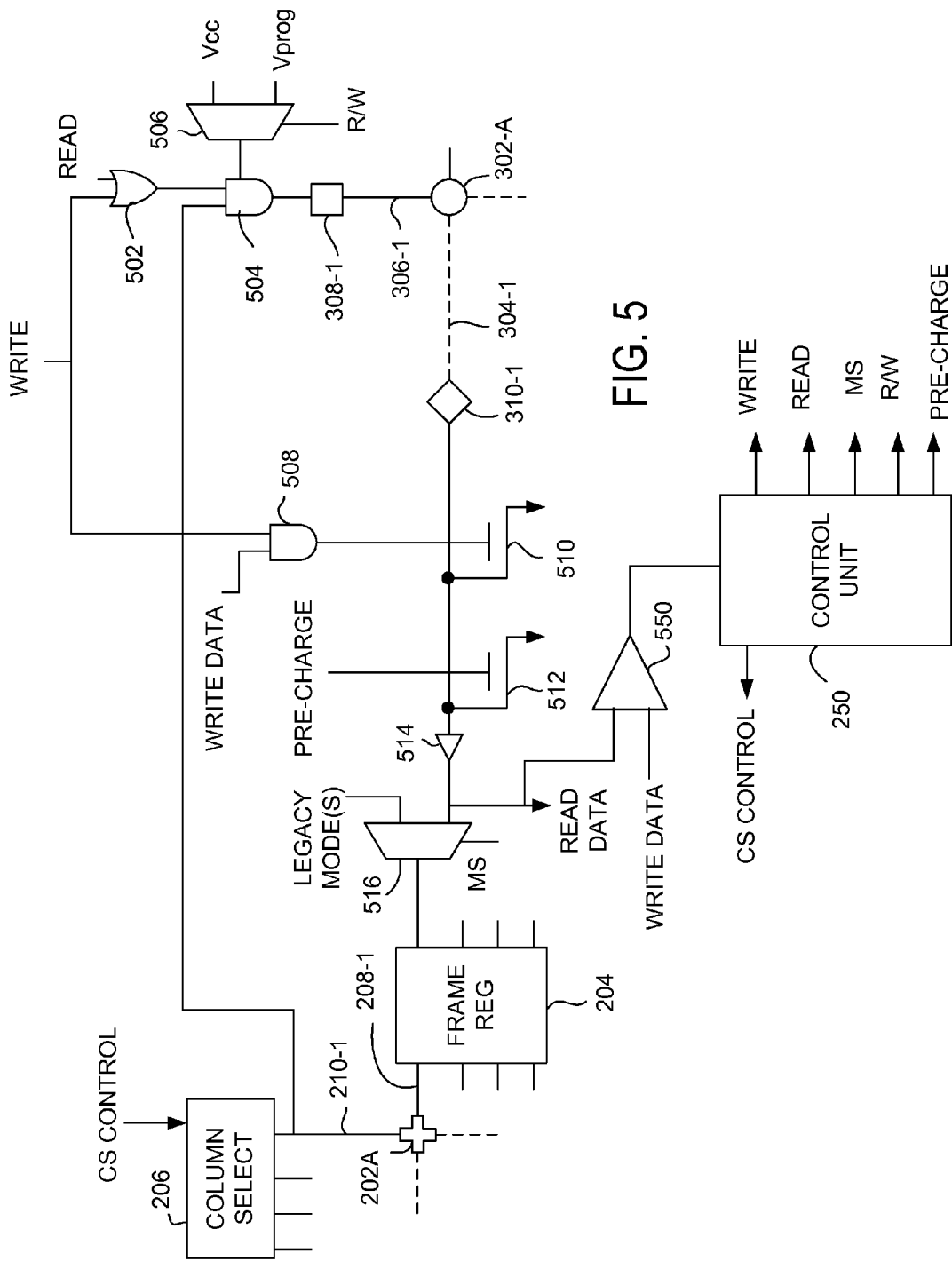
FIG. 5 is a block diagram depicting an exemplary embodiment of a portion of an interface circuit between a non-volatile memory and configuration memory in accordance with one or more aspects of the invention.

FIG. 5 is a block diagram depicting an exemplary embodiment of a portion 500 of the interface circuit 118 in accordance with one or more aspects of the invention. In the present embodiment, the memory cells 302 comprise write-once memory elements, such as fuses, antifuses, polymer memory elements, and the like. The portion 500 is shown with respect to a memory cell 302A, which is one of the memory cells 302 in the non-volatile memory 301, and a memory cell 202A, which is one of the memory cells 202 in the configuration memory 201. Also shown is a column electrode 306-1, which is one of the column electrodes 306, and a row electrode 304-1, which is one of the row electrodes 304. Corresponding column and row connection points 308-1 and 310-1 are also shown. Also shown is a data line 208-1, which is one of the data lines 208, and a select line 210-1, which is one of the select lines 210. The column select logic 206 is collectively shown as a box having output terminals for driving the select lines 210, the connection to the select line 210-1 being shown. The frame register 204 is shown connected to the data line 208-1. A control unit 250, which may be part of the configuration logic 116 and/or the interface circuit 118, is also shown.

The portion 500 includes an OR gate 502, an AND gate 504, voltage selection logic 506, an AND gate 508, a transistor 510, a transistor 512, a buffer 514, and a multiplexer 516. One input of the OR gate 502 is configured to receive a read signal. Another input of the OR gate 502 is configured to receive a write signal. The read and write signals are generated by the control unit 250. An output of the OR gate 502 is coupled to one input of the AND gate 504. Another input of the AND gate 504 is coupled to the column select logic 206. A control input of the AND gate 504 is coupled to an output of the voltage selection logic 506. An output of the AND gate 504 is coupled to the column electrode 306-1 at the column connection point 308-1. The voltage selection logic 506 is configured to control the AND gate 504 to output either a voltage Vcc or a voltage Vprog when the AND gate 504 outputs a logic '1'. Thus, the voltage selection logic 506 is schematically represented by a multiplexer having two inputs respectively receiving voltages Vcc and Vprog, and an output coupled to the control input of the AND gate 504. The selection of Vcc or Vprog is driven by the control unit 250 via a signal R/W.

The column electrode 306-1 is coupled to one side of the memory cell 302A. One input of the AND gate 508 is configured to receive a write data signal. Another input of the AND gate 508 is configured to receive the write signal. An output of the AND gate 508 is coupled to a gate of the transistor 510, as well as the row electrode 304-1 at the row connection point 310-1. A source of the transistor 510 is coupled to ground. A drain of the transistor 510 is coupled to the row electrode 304-1 at the row connection point 310-1. The row electrode 304-1 is coupled to the other side of the memory cell 302A.

A gate of the transistor 512 is configured to receive a pre-charge signal. The pre-charge signal is generated by the control unit 250. A source of the transistor 512 is coupled to ground. A drain of the transistor 512 is coupled to the row electrode 304-1 at the row connection point 310-1. An input of the buffer 514 is coupled to the row electrode 304-1 at the row connection point 310-1. An output of the buffer 514 is coupled to an input of the multiplexer 516. The output of the buffer 514 also provides a read data signal. Other input(s) of the multiplexer 516 is/are coupled to legacy configuration circuit(s) for implementing legacy configuration mode(s). An output of the multiplexer 516 is coupled to the frame register 204, which is coupled to the data line 208-1. A control input of the multiplexer 516 is configured to receive a mode selection signal (MS). The MS signal is generated by the control unit 250. The data line 208-1 is coupled to a data port of the memory cell 202A. A control port of the memory cell 202A is coupled to the select line 210-1. The select line 210-1 is in turn coupled to the column select logic 206. Those skilled in the art will understand how to construct the control unit 250 based on the functional description that follows.

A read operation may be performed as follows: Generally, a write-once memory cell may be read by attempting to pass current therethrough and determining whether the attempt is successful (or unsuccessful). For example, current may be sensed using a pull-up or pull-down resistor to convert the current to a voltage that can be interpreted as a logical '1' or a logical '0'. In the example shown in FIG. 5, however, a pre-charge mechanism is used to conserve power. First, the column select logic 206 selects a column of memory cells (by asserting the select line 210-1) in the configuration memory 201 and enables the memory cells for write, including the memory cell 202A. The column select logic 206 may be controlled by the control unit 250. The control unit 250 generates the mode selection signal to cause the multiplexer 516 to select the output of the buffer 514 (i.e., internal configuration mode). Next, the control unit 250 asserts the pre-charge signal to ground the row electrode 304-1. An asserted pre-charge signal causes the transistor 512 to turn on, which pulls the row electrode 304-1 to ground. This causes the frame register 204 to store a logic '0' for the memory cell 202A (as well as the other memory cells coupled to the select line 210-1). The pre-charge phase is completed by de-asserting the pre-charge signal. The column select logic 206 then strobes the memory cells on the select line 210-1, which causes the transfer of the logical '0' values from the frame register 204.

After the pre-charge phase, the column electrode 306-1 is asserted. In particular, one input of the AND gate 504 is asserted by the column select logic 206 in common with the select line 210-1. The control unit 250 asserts the read signal, which causes the OR gate 502 to assert the other input of the AND gate 504. The control unit 250 configures the voltage selection logic 506 to drive the AND gate 504 with the voltage Vcc, which is a voltage insufficient to open (or close in case of antifuse) the write-once memory cells. The voltage Vcc is applied to each of the memory cells coupled to the column electrode 306-1, including the memory cell 302A. If the memory cell 302A is open, then no (negligible) current flows through to the row electrode 304-1. The input of the buffer 514 is at a negligible voltage and the logic '0' stored in the frame register 204 remains unchanged. If the memory cell 302A is closed, then a current flows through to the row electrode 304-1. The voltage Vcc, less a drop over the memory cell 302A, is applied to the input of the buffer 514, which causes the frame register 204 to store a logical '1'. In essence, the buffer 514 is performing the current sensing function. This operation is performed in parallel for all of the memory cells 302 on the column electrode 306-1. Thus, the frame register 204 stores a bit sequence, which is loaded into the corresponding memory cells on the select line 210-1 in response to a write strobe by the column select logic 206. This process is repeated for additional column electrodes 306 and additional select lines 210.

In some embodiments, the pre-charge data is not strobed into the memory cells 204 during the pre-charge phase, as described above. The pre-charge strobe may be omitted and only the bit sequence data transferred to the memory cells 204, again as described above.

In some embodiments, data may be read from the non-volatile memory 301 during operation of the FPGA for purposes other than configuration (during "runtime"). The read data signal provides the stored data for use by other circuits in the FPGA, such as a user design configured in the programmable logic. In some embodiments, the stored data is provided to the programmable logic by way of the frame register 204.

A write operation may be performed as follows: First, the control unit 250 controls the column select logic 206 to select one of the column electrodes 306 (the column electrode 306-1 in the present example). Data to be written to the memory cell 302A is provided by the write data signal. In some embodiments, the write data signal is provided by other circuits in the FPGA, such as by a user design configured in the programmable logic or a dedicated logic circuit in the FPGA. In other embodiments, the write data signal is provided by the frame register 204. The control unit 205 causes the voltage selection logic 506 to drive the AND gate 504 with the voltage Vprog. The control unit 250 then asserts the write signal. This causes the OR gate 502 to assert one of the inputs of the AND gate 504 (the other input is asserted by the column select logic 206), which causes the AND gate 504 to drive the column electrode 306-1 with the voltage Vprog. The asserted write signal also causes the write data signal to pass through the AND gate 508 (i.e., the AND gate 508 outputs a logic '0' or a logic '1' in accordance with the write data signal), which causes the transistor 510 to turn on or off in accordance with the write data signal. If the write data signal is a logic '1', then the transistor 510 turns on and pulls the row electrode 304-1 to ground. If the write data signal is a logic '0', then the transistor 510 is off and the row electrode 304-1 is not grounded. If the row electrode 304-1 is grounded due to the write data signal being a logic '1', then a current flows through the memory cell 302A such that the memory cell opens (or closes in case of antifuse). Otherwise, the memory cell 302A remains closed (or opened in case of antifuse). All of the memory cells coupled to the column electrode 306-1 are opened or remain closed in this manner. This process is repeated for additional column electrodes 306.

In some embodiments, after a column of memory cells is written, a read may be performed to a comparator 550 to determine whether the writing was effective. That is, one input of the comparator 550 is configured to receive the write data signal and another input of the comparator 550 is configured to receive the read data signal. After the write operation, the write data signal maintains its state and a read operation is performed with the column electrode 306-1 still selected. The comparator 550 compares the write data signal and the read data signal to determine if the write was successful. The output of the comparator 550 is coupled to the control unit 250, which can re-execute the write operation if necessary.

The OR gate 502 and the AND gate 504 comprise a first circuit. The interface circuit 118 includes multiple first circuits, each coupled between the column select logic 206 and a respective one of the column electrodes. The voltage selection logic 506 may be part of each first circuit, or may be common among all of the first circuits. The AND gate 508, the transistor 510, the transistor 512, and the buffer 514 comprise a second circuit. The interface circuit 118 includes multiple second circuits, each coupled between a respective one of the data lines 208 and a respective one of the row electrodes 304. The multiplexer 516 is also replicated for each of the data lines 208-1. Thus, a multiplexer and the frame register 204 may be disposed between the second circuits and the data lines 208. It is to be understood that the pre-charge and the write data mechanisms may share a common pull-down transistor. That is, the transistor 512 and the transistor 510 may be replaced by a single pull down transistor, the gate of which is coupled to the AND gate 508 and configured to receive the pre-charge signal.

Figure 6:
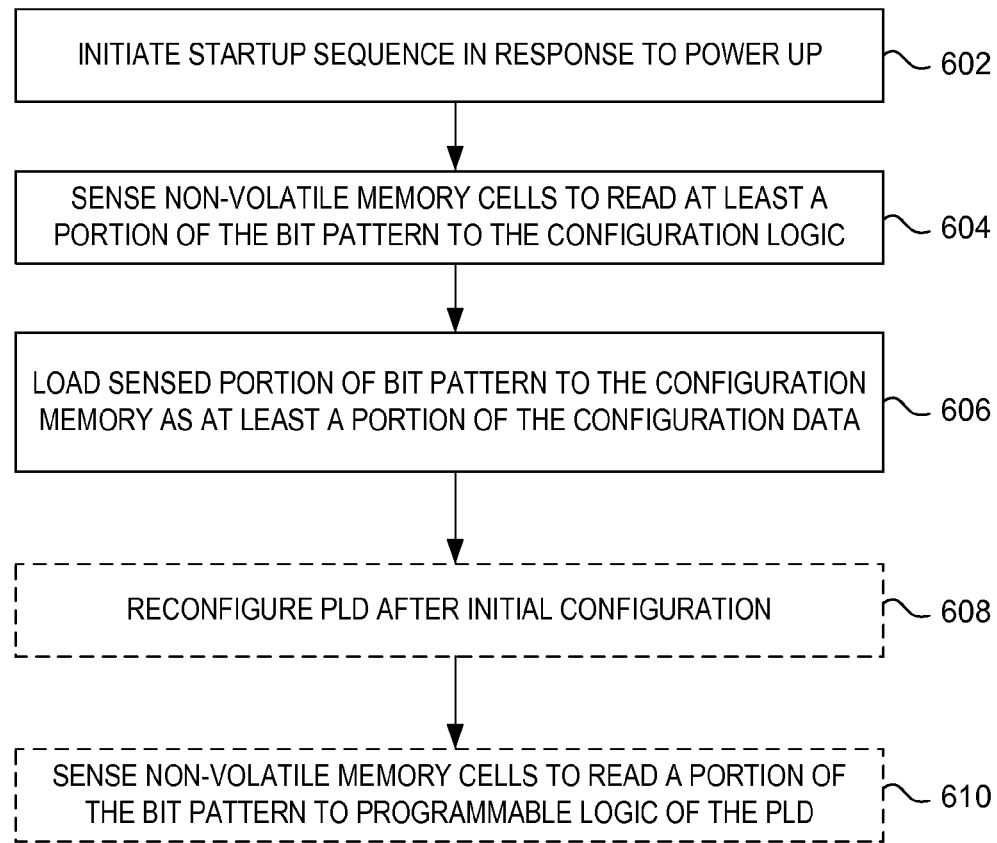
FIG. 6 is flow diagram depicting an exemplary embodiment of a method for initializing a PLD having a non-volatile memory in accordance with one or more aspects of the invention.

FIG. 6 is flow diagram depicting an exemplary embodiment of a method 600 for initializing a PLD having an internal non-volatile memory in accordance with one or more aspects of the invention. As described above, a non-volatile memory of a PLD includes an array of memory cells. Using a write process, the array of memory cells may have their state selectively changed to define a bit pattern. The bit pattern corresponds to a bitmap of logic '1's and '0's. The method 600 begins at step 602, where power is applied to the PLD and a startup sequence is initiated. The startup sequence may be initiated by a controller in the configuration logic of the PLD (e.g., the control unit 250 described above). In particular, the startup sequence places the PLD in the internal configuration mode such that the PLD will be configured at least in part using at least a part of the bit pattern in the non-volatile memory.

At step 604, the memory cells are sensed to read at least a portion of the bit pattern (bitmap) to the configuration logic. At step 606, the sensed portion of the bit pattern is loaded to the configuration memory as at least a portion of the configuration data for the PLD. The memory cells are sensed using read operations. Although steps 604 and 606 are shown as logical steps performed sequentially, it is understood from the above description that the sensing and loading of configuration data occurs on a column-by-column basis. Thus, steps 604 and 606 do not imply any particular time order, but rather describe two different functional steps required to transfer data from the non-volatile memory to the configuration memory.

At this point, the entire configuration memory may be loaded with configuration data to program the entire PLD with a circuit. For example, the non-volatile memory may store a default configuration for the PLD. The default configuration ensures that the PLD will be programmed with some default functionality regardless of whether the PLD is connected to an external source of configuration data. At optional step 608, the PLD may be reconfigured after the initial configuration by the non-volatile memory. For example, the PLD may be reconfigured using configuration data obtained from an external source (e.g., an external memory). Alternatively, the PLD may be reconfigured by sensing an additional portion of the bit pattern of the non-volatile memory. That is, the memory may include multiple configurations of the PLD, including a default configuration. After the default configuration is loaded, a user may cause another configuration stored in the non-volatile memory to be loaded in a manner similar to steps 604 and 606.

At optional step 610, the memory cells may be sensed to read a portion of the bit pattern (bitmap) to programmable logic of the PLD during runtime. That is, in addition to configuration data, the non-volatile memory may store other information that can be used by circuits configured in the PLD during runtime.

Figure 7:
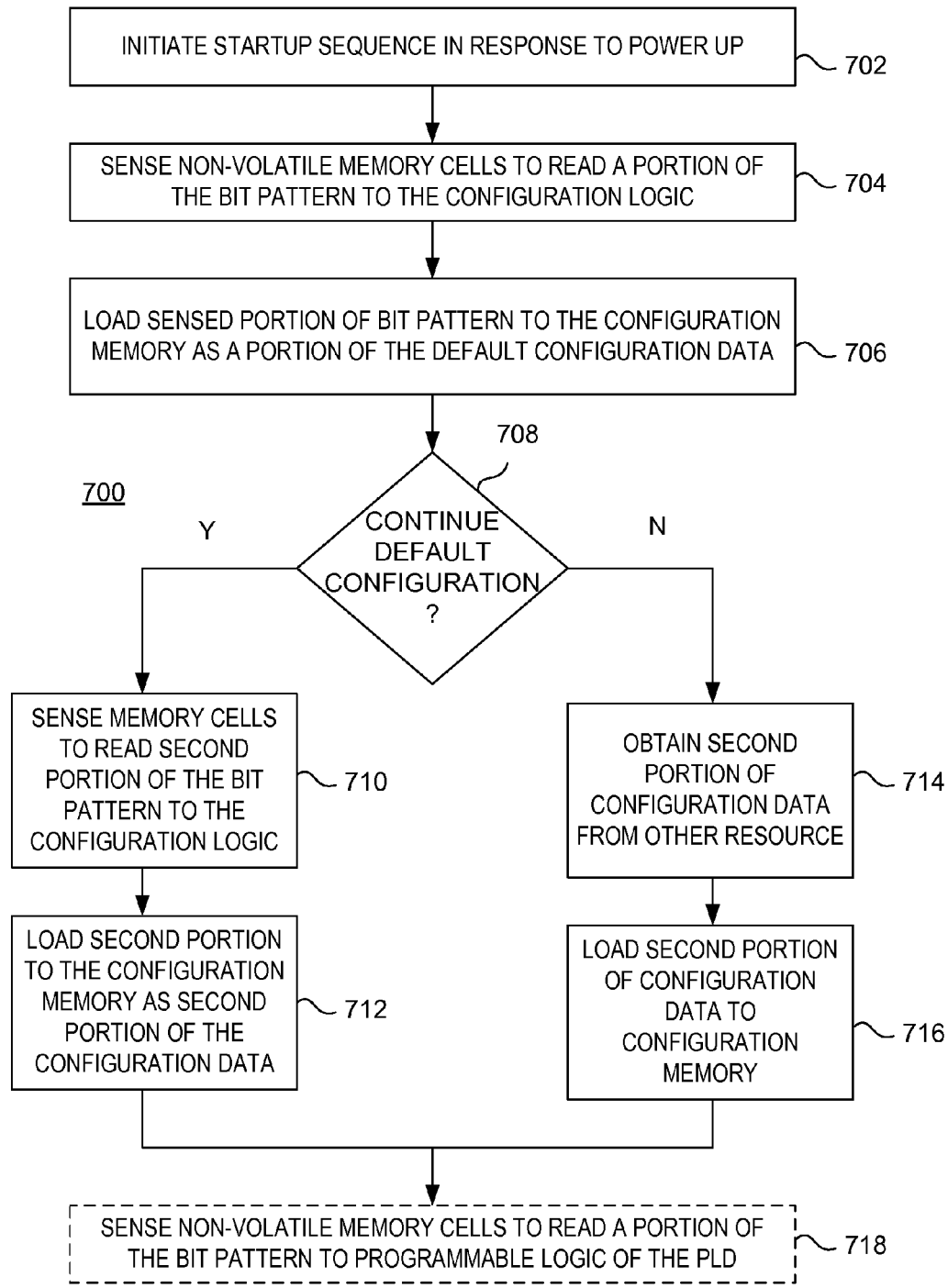
FIG. 7 is a flow diagram depicting another exemplary embodiment of a method for initializing a PLD having a non-volatile memory in accordance with one or more aspects of the invention.

FIG. 7 is a flow diagram depicting another exemplary embodiment of a method 700 for initializing a PLD having an internal non-volatile memory in accordance with one or more aspects of the invention. In the present embodiment, only a first portion of the bit pattern is sensed to load a first portion of the configuration data into the configuration memory. The first portion of configuration data may define some basic functionality in the PLD that can be used to provide a conditional configuration control mechanism (i.e., in the programmable logic). For example, the non-volatile memory may store a default configuration for the PLD. The default configuration may allow a user the option of programming the PLD with the default circuit, or programming the PLD with another user-defined circuit.

The method 700 begins at step 702, where power is applied to the PLD and a startup sequence is initiated. The startup sequence may be initiated by a controller in the configuration logic of the PLD (e.g., the control unit 250 described above). In particular, the startup sequence places the PLD in the internal configuration mode such that the PLD will be configured at least in part using at least a part of the bit pattern in the memory.

At step 704, the memory cells are sensed to read a portion of the bit pattern (bitmap) to the configuration logic. At step 706, the sensed portion of the bit pattern is loaded to the configuration memory as a portion of the default configuration data for the PLD. The memory cells are sensed using read operations. Again, steps 704 and 706 do not imply any particular time order, but rather describe two different functional steps required to transfer data from the non-volatile memory to the configuration memory.

At step 708, a determination is made whether to continue configuring the PLD with the default configuration from the non-volatile memory. The decision to continue with the default configuration or with a new configuration is made upon instruction of the conditional configuration control mechanism, which may look to some predefined resource that is controllable by the user. If so, the method 700 proceeds to step 710.

At step 710, the memory cells are sensed to read a second portion of the bit pattern (bitmap) to the configuration logic. At step 712, the second portion of the bit pattern is loaded to the configuration memory as a second (e.g., remaining) portion of the configuration data for the PLD. Again, steps 710 and 712 do not imply any particular time order, but rather describe two different functional steps required to transfer data from the non-volatile memory to the configuration memory. At this time, the PLD is configured with the default configuration to program a default circuit.

If at step 708 a decision is made to discontinue reading the default configuration, the method 700 proceeds to step 714. At step 714, a second portion of the configuration data is obtained from a resource designated by the conditional configuration control mechanism. For example, the designated resource may comprise an external memory. Alternatively, the designated resource may comprise the non-volatile memory. As described above, the non-volatile memory may store multiple configurations, including the default configuration. The second portion of the configuration data may be another configuration stored in the non-volatile memory. At step 716, the second portion of the configuration data is loaded to the configuration memory. Again, steps 714 and 716 do not imply any particular time order, but rather describe two different functional steps required to transfer data from the non-volatile memory to the configuration memory. At step 716, the configuration mode may be changed from the internal configuration mode to a legacy mode in the case where the second portion is to be obtained from an external resource. At this time, the PLD is configured with a user-selected configuration, rather than the default configuration.

Similar to the method 600, at optional step 718, the memory cells may be sensed to read a portion of the bit pattern (bitmap) to programmable logic of the PLD during runtime. That is, in addition to configuration data, the non-volatile memory may store other information that can be used by circuits configured in the PLD during runtime.

Method and apparatus for initializing a programmable logic device have been described. Some aspects of the invention relate to a PLD have an internal non-volatile memory for storing configuration data. The internal non-volatile memory is formed using additional process layers of the PLD IC above the existing process layers for the programmable and configuration logic. Interface circuitry to the non-volatile memory may be formed with the configuration logic. In particular, the column select logic for selecting a column of configuration memory cells may be shared with the non-volatile memory for the purposes of selecting a column of non-volatile memory cells. The interface circuitry also includes read/write logic for reading and writing the non-volatile memory. The non-volatile memory (so constructed) has little area impact on the PLD IC. Data transfer between the non-volatile memory and the configuration memory uses the full width of the configuration frame, allowing the PLD to be configured one frame per memory access. As such, the internal configuration using the non-volatile memory is faster than legacy configuration methods.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. An integrated circuit, comprising:
a static memory including an array of memory cells having control lines coupled to a column select component and data lines coupled to a register component, the static memory formed in one or more first process layers of the integrated circuit;
a non-volatile memory including an array of non-volatile memory cells disposed between column electrodes and row electrodes, the non-volatile memory cells formed in one or more second process layers disposed above the one or more first process layers; and
an interface circuit configured to couple the column select component to the column electrodes and the register component to the row electrodes.

2. The integrated circuit of claim 1, wherein the non-volatile memory is disposed in process layers of the integrated circuit above the static memory.

3. The integrated circuit of claim 1, wherein the non-volatile memory cells comprise write-once memory cells, and wherein the interface circuit includes:
first circuits, respectively coupled between the column select component and the column electrodes, configured to apply voltage to a selected one of the column electrodes;
second circuits, respectively coupled between the data lines and the row electrodes, configured to sense current on the row electrodes.

4. The integrated circuit of claim 3, wherein each of the first circuits includes:
a first input configured to receive a read signal;
a second input configured to receive a write signal;
a third input configured to receive a select signal from the column select component; and
voltage select logic configured to cause the voltage applied to the selected column electrode to be a first voltage responsive to the read signal and a second voltage responsive to the write signal, the first voltage being insufficient to change character of the write-once memory cells and the second voltage being sufficient to change the character of the write-once memory cells.

5. The integrated circuit of claim 4, wherein each of the second circuits includes:
a first input configured to receive a write data signal from the register component;
a second input configured to receive the write signal; and
at least one pull-down transistor coupled to a respective one of the row electrodes; and
a buffer coupled between a respective one of the row electrodes and a respective one of the data lines.

6. The integrated circuit of claim 5, wherein each of the second circuits further includes a third input configured to receive a pre-charge signal.

7. The integrated circuit of claim 3, further comprising:
multiplexers respectively coupled between the data lines and the second circuits.

8. The integrated circuit of claim 3, further comprising:
programmable logic;
wherein the second circuits are further coupled to the programmable logic.

9. The integrated circuit of claim 1, further comprising:
programmable logic;
wherein the static memory comprises configuration memory for the programmable logic.

10. The integrated circuit of claim 1, wherein the non-volatile memory cells comprise one of fuse elements, antifuse elements, polymer elements, or multiwrite elements.

11. An integrated circuit, comprising:
a programmable resource;
a configuration memory for storing configuration data to configure the programmable resource;
a configuration resource for loading the configuration data to the configuration memory;
a non-volatile memory including an array of non-volatile memory cells; and
an interface circuit, coupled between the configuration resource and the non-volatile memory, configured to selectively change character of the non-volatile memory cells to write a bitmap, and sense the non-volatile memory cells to read a portion of the bitmap to the configuration resource as a portion of the configuration data.

12. The integrated circuit of claim 11, wherein the configuration resource includes a frame register, wherein the configuration data comprises a plurality of frames each being a width of the frame register, and wherein the interface circuit senses the non-volatile memory cells to read the portion of the bitmap a frame at a time.

13. The integrated circuit of claim 11, wherein the configuration resource includes a frame register component and a column select component, and wherein the non-volatile memory shares the column select component with the configuration resource.

14. The integrated circuit of claim 13, wherein the interface circuit is further configured to sense the non-volatile memory to read a portion of the bitmap to the programmable resource during runtime.

15. The integrated circuit of claim 11, wherein the non-volatile memory cells are disposed between column electrodes and row electrodes.

16. A method of initializing an integrated circuit having a configuration resource formed in one or more first process layers and a non-volatile memory formed in one or more second process layers disposed above the one or more first process layers, the non-volatile memory including an array of non-volatile memory cells a portion of which are configured to define a bitmap, the method comprising:

sensing the non-volatile memory cells to read a portion of the bitmap to the configuration resource; and loading the portion of the bitmap from the configuration resource to configuration memory as a portion of the configuration data for the integrated circuit.

17. The method of claim 16, further comprising:

sensing, upon instruction of the portion of the configuration data, the non-volatile memory cells to read another portion of the bitmap to the configuration resource; and loading the other portion of the bitmap from the configuration resource to the configuration memory as another portion of the configuration data.

18. The method of claim 16, further comprising:

obtaining, upon instruction of the portion of the configuration data, another portion of the configuration data from an external memory coupled to the integrated circuit; and loading the other portion of the configuration data to the configuration memory.

19. The method of claim 16, further comprising:

sensing, during runtime of the integrated circuit, the non-volatile memory cells to read another portion of the bitmap to programmable resource of the integrated circuit.

20. The method of claim 16, wherein the non-volatile memory cells are disposed between column electrodes and row electrodes, and wherein the step of sensing comprises:

applying a column select signal from the configuration resource to the non-volatile memory to select one of the column electrodes;

applying voltage to the selected column electrode, the voltage insufficient to change character of the non-volatile memory cells; and sensing current on the row electrodes, the current on each of the row electrodes being indicative of a bit of the bitmap.

* * * * *